(12) United States Patent
Yang et al.

(10) Patent No.: US 9,093,126 B2
(45) Date of Patent: Jul. 28, 2015

(54) MEMORY CIRCUIT

(75) Inventors: Chen-Lin Yang, Hsinchu (TW);
Kao-Cheng Lin, Hsinchu (TW);
Chung-Hsien Hua, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 543 days.

(21) Appl. No.: 13/563,571

(22) Filed: Jul. 31, 2012

(65) Prior Publication Data

US 2014/0036580 A1    Feb. 6, 2014

(51) Int. Cl.
*G11C 7/06* (2006.01)
*G11C 7/04* (2006.01)
*G11C 11/413* (2006.01)
*G11C 7/14* (2006.01)

(52) U.S. Cl.
CPC ........ *G11C 7/04* (2013.01); *G11C 7/062* (2013.01); *G11C 7/067* (2013.01); *G11C 7/14* (2013.01); *G11C 11/413* (2013.01)

(58) Field of Classification Search
CPC ............ G11C 7/04; G11C 7/062; G11C 7/14; G11C 11/413

USPC .......... 365/189.07, 189.15, 189.09, 193, 194
See application file for complete search history.

(56) References Cited

U.S. PATENT DOCUMENTS

| | | | |
|---|---|---|---|
| 6,282,131 B1 * | 8/2001 | Roy | 365/191 |
| 6,788,615 B2 * | 9/2004 | Becker | 365/230.03 |
| 7,746,716 B2 * | 6/2010 | Jetton et al. | 365/210.1 |
| 7,755,964 B2 * | 7/2010 | Jung et al. | 365/210.1 |
| 7,979,832 B2 * | 7/2011 | Jung et al. | 716/134 |
| 8,040,746 B2 * | 10/2011 | Jain et al. | 365/203 |
| 8,125,845 B2 * | 2/2012 | Komatsu et al. | 365/203 |
| 8,315,085 B1 * | 11/2012 | Chang et al. | 365/154 |
| 8,467,257 B1 * | 6/2013 | Liu et al. | 365/196 |
| 8,570,789 B2 * | 10/2013 | Chang | 365/154 |
| 8,630,132 B2 * | 1/2014 | Cheng et al. | 365/189.14 |
| 8,630,135 B2 * | 1/2014 | Douzaka | 365/194 |
| 8,804,438 B2 * | 8/2014 | Sharma et al. | 365/189.05 |
| 8,848,414 B2 * | 9/2014 | Arsovski et al. | 365/49.17 |
| 8,923,069 B2 * | 12/2014 | Sahu et al. | 365/185.23 |
| 2014/0010032 A1 * | 1/2014 | Seshadri et al. | 365/203 |

* cited by examiner

*Primary Examiner* — Viet Q Nguyen
(74) *Attorney, Agent, or Firm* — McDermott Will & Emery LLP

(57) ABSTRACT

A memory circuit is provided. The memory circuit includes a memory array having a bit line (BL), and a memory cell coupled to the BL; a sense amplifier (SA) coupled to the BL; a tracking bit line (TRKBL); and a comparator coupled to the TRKBL and configured to receive a reference voltage, and to output a strobe signal to the SA.

20 Claims, 9 Drawing Sheets

United States Patent US 9,093,126 B2

MEMORY CIRCUIT

FIELD

The present disclosure relates to a memory circuit.

BACKGROUND

Static Random Access Memories (SRAMs) are semiconductor elements widely applied in modern computing devices. For the efficiency of operation, a "self-timed" SRAM is developed, which controls timing independently of the externally generated clock signal.

In a self-timed SRAM design, in order to generate enough bit line (BL) differential voltage values for robustly reading out sensing results, a bitcell tracking design is applied, where a tracking bitline (TRKBL) is used to model the BL discharge delay of the accessed BL and then generate sense amplifier (SA) firing and word line (WL) falling edges.

However, the trip point variation across Process/Voltage/Temperature (PVT) causes a significant gate delay fluctuation on a tracking BL receiver (usually implemented by an inverter or a NAND gate), which makes the SA being fired too early at the slow-fast (SF) corner or too late at the slow-slow (SS) corner, and thus degrades the tracking ratio. The SF corner denotes slow n-channel metal-oxide-semiconductor field-effect transistors (n-channel MOSFETs, or NMOSs) and fast p-channel metal-oxide-semiconductor field-effect transistors (p-channel MOSFETs, or PMOSs), and the SS corner denotes slow NMOSs and slow PMOSs. The tracking ratio is a performance indicator defined as the read margin at WCL (Worst Case Low Temperature, or speed sign off corner) over the read margin at the worst case PVT. The larger the ratio indicates the more read margin is wasted at WCL in order to make the read margin at the worst case PVT able to overcome the offset of the trip point of the SA. Since the read margin is desired to be constant across PVT, the closer to 1 the ratio is, the better the compensation performance is.

In order to cover earlier SA firing cases at the SF corner, more margins have to be put on the wordline (WL) to SAE (SA enabling) delay, for instance. One way to add margins is adding a logic gate delay after the TRKBL receiver, but this damages SRAM access time and develop redundant read margin at slow corners, such as the SS corner.

SUMMARY

In accordance with one aspect of the present disclosure, a memory circuit includes: a memory array having a bit line (BL), and a memory cell coupled to the BL; a sense amplifier (SA) coupled to the BL; a tracking bit line (TRKBL); and a comparator coupled to the TRKBL and configured to receive a reference voltage, and to output a strobe signal to the SA.

In accordance with another aspect of the present disclosure, a memory circuit includes: a sense amplifier (SA); a memory array coupled to the SA through a bit line (BL); a tracking bit line (TRKBL); and a tracking bit line receiver (TRKBL receiver) coupled to the TRKBL and configured to receive a reference voltage, and to provide a strobe signal to the SA.

In accordance with one more aspect of the present disclosure, a memory circuit having a sense amplifier (SA) and a tracking bit line (TRKBL) having a voltage includes: a receiving circuit coupled to the TRKBL and configured to receive a reference voltage, and to use the reference voltage and the voltage of the TRKBL to activate the SA.

The present disclosure may best be understood through the following descriptions with reference to the accompanying drawings, in which:

DETAILED DESCRIPTION

Figure 1:
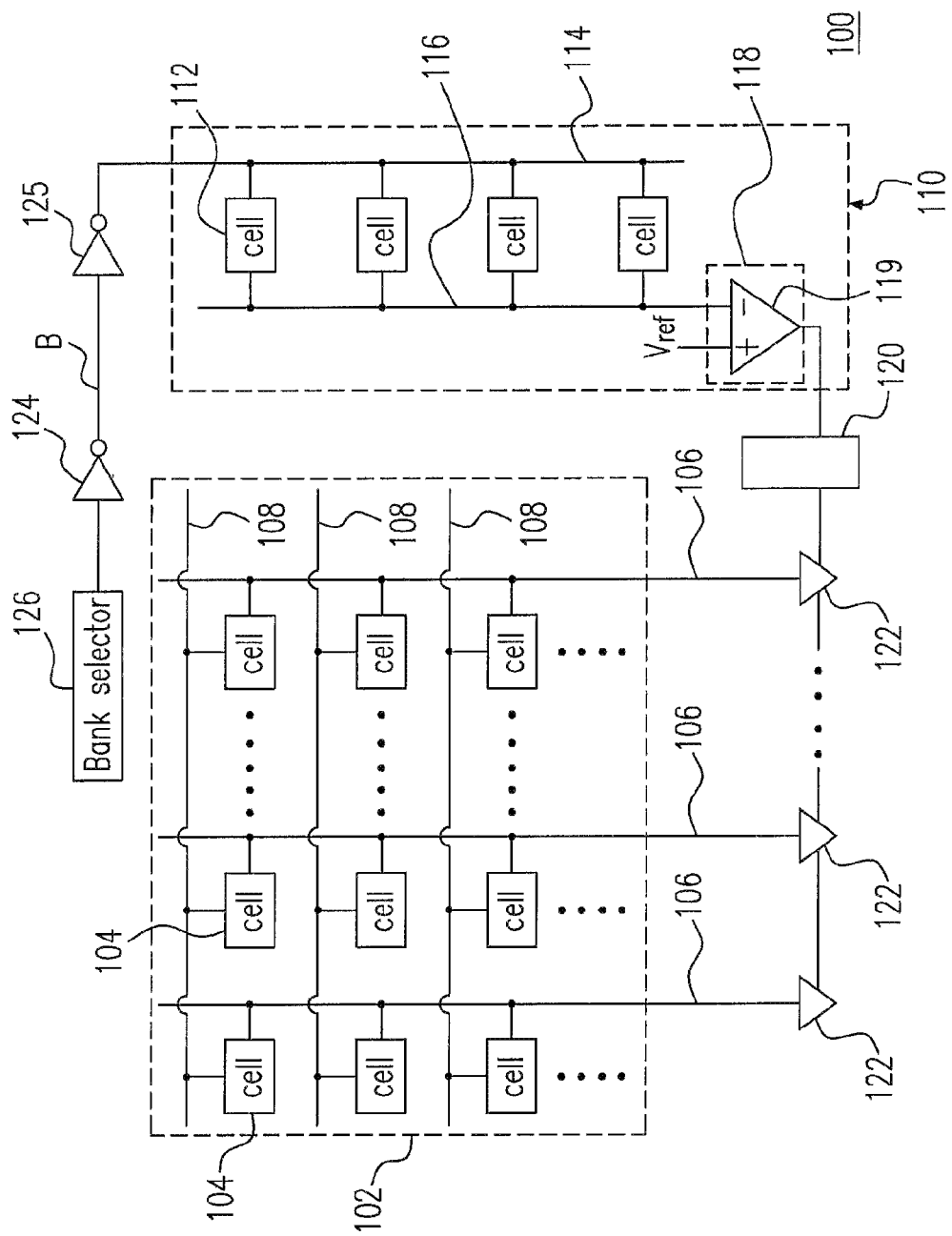
FIG. 1 is a schematic diagram illustrating a static random access memory circuit 100 in accordance with an embodiment of this disclosure.

The present disclosure is described with respect to particular embodiments and with reference to certain drawings, but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

FIG. 1 is a schematic diagram of a static random access memory circuit 100 in accordance with an embodiment of this disclosure. The memory circuit 100 includes a memory array 102, a plurality of sense amplifiers 122, a tracking circuit 110, and a bank selector 126.

The memory array 102 includes a plurality of columns of bitlines 106, a plurality of rows of wordlines 108, and a plurality of memory cells 104 situated approximately at a plurality of cross-point locations where the bitlines 106 and the wordlines 108 cross through each other but do not physically intersect. A plurality of bitline bars corresponding to bitlines are omitted for simplifying the figure. The memory cells 104 are coupled to the corresponding bit lines 106 and wordlines 108 as shown in FIG. 1. In the read cycle, the differential voltages between the bitlines and the bitline bars are detected by the plurality of sense amplifiers 122.

The tracking circuit 110 is coupled to the plurality of sense amplifiers 122 through a tunable logic delay 120, and includes a plurality of tracking cells 112, a tracking bitline 116, a tracking wordline 114 and a tracking bitline receiver 118 coupled to the tracking bitline 116 and configured to receive a reference voltage Vref. The tracking cells 112 and the tracking bitline 116 are utilized to simulate the memory cells 104 and the bitlines 106 in the memory array 102. The tracking cells 112 are coupled to the tracking bitlines 116 and the tracking wordlines 114.

The memory circuit 100 further includes a bank selector 126 coupled to the tracking wordline 114 via an inverter 124 and an inverter 125.

During a read operation of the memory circuit 100, the tracking bitline 116 is discharged, and the tracking bitline receiver 118 detects the voltage level of the tracking bitline 116 and compares the voltage level of the tracking bitline 116 with the reference voltage Vref. Once the voltage level of the tracking bitline 116 is pulled down below the level of Vref, the tracking bitline receiver 118 generates a strobe signal for enabling the corresponding sense amplifiers 122. The tracking bitline receiver 118 is a comparator, for example. In an embodiment, the tracking bitline receiver 118 is implemented by using an operational amplifier 119 as a comparator whose inverting input terminal is coupled to the tracking bitline 116 and non-inverting input terminal is configured to receive the reference voltage Vref. Since the tracking bitline 116 is precharged to a relatively high voltage, namely Vcc (the supply voltage or VDD), and the reference voltage Vref is chosen to be at a voltage level between the logical high and the logical low voltages, for example at 0.5 Vcc, the operational amplifier 119 is configured to output a negative saturation voltage at first. Once the voltage received by the inverting input terminal is discharged to a level smaller than the reference voltage Vref at the non-inverting input terminal, the operational amplifier 119 is configured to output a positive saturation voltage as the strobe signal to drive the sense amplifiers 122.

Figure 2:
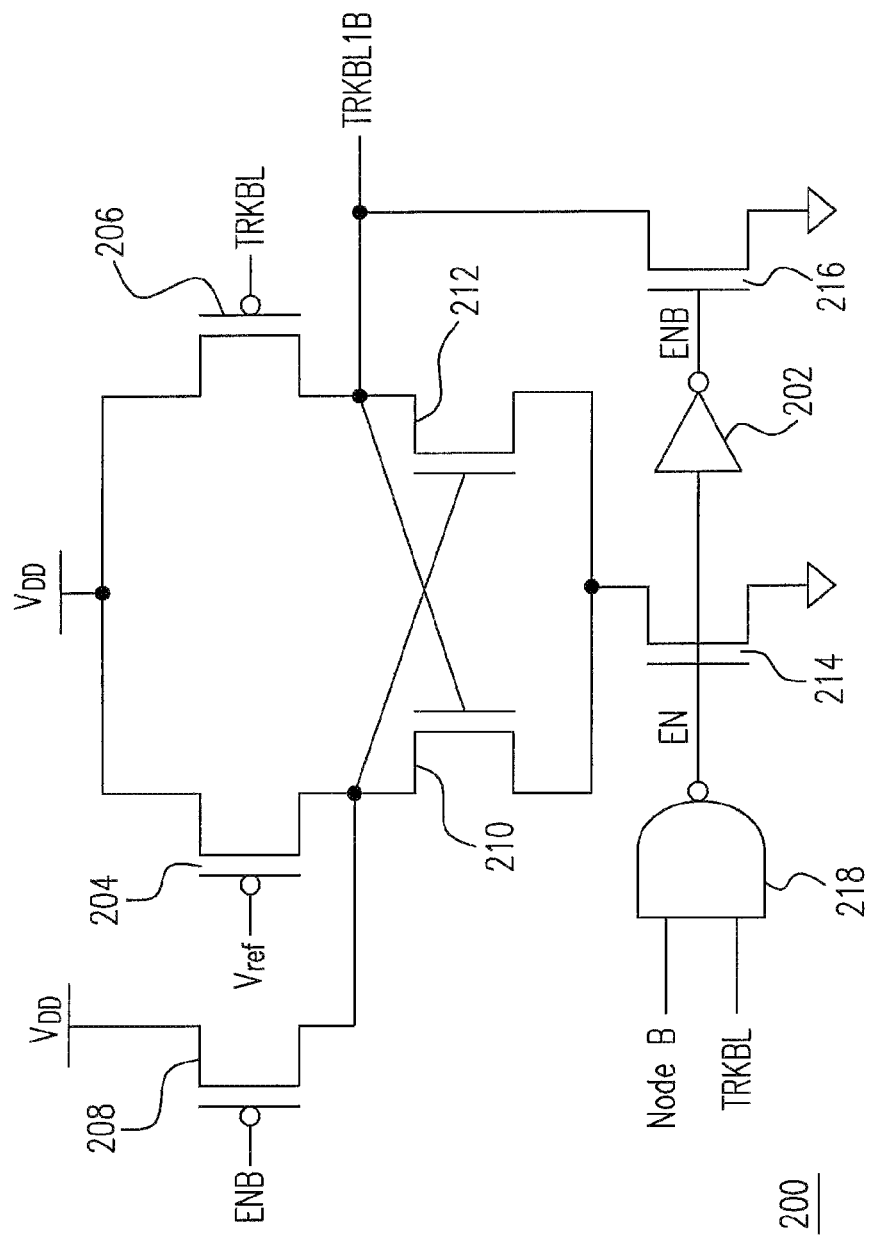
FIG. 2 is a schematic diagram illustrating an implementation for a comparator in accordance of an embodiment in this disclosure.

FIG. 2 illustrates a schematic diagram implementing a comparator 200 used as the tracking bitline receiver 118 in FIG. 1 in accordance of an embodiment in this disclosure. The comparator 200 includes an inverter 202, multiple p-channel MOSFETs (PMOSs) 204, 206 and 208, and multiple n-channel MOSFETs (NMOSs) 210, 212, 214 and 216. The upper two PMOSs 204 and 206 in FIG. 2 form a PMOS differential pair, and the lower two NMOSs 210 and 212 in FIG. 2 form an NMOS cross-coupling pair.

The sources of the PMOSs 204 and 206 are coupled to a power supply voltage, VDD voltage. The gate of the PMOS 204 is configured to receive the reference voltage Vref, which is 0.8 Vcc in this embodiment. The gate of the PMOS 206 is coupled to the tracking bitline TRKBL. The drain of the NMOS 210 is coupled to the drain of the PMOS 204. The drain of the NMOS 212 is coupled to the drain of the PMOS 206. The sources of the NMOSs 210 and 212 are coupled to the drain of the NMOS 214. The source of the NMOS 214 is coupled to a supply reference voltage VSS, which, in some embodiments, is ground. The drain of the NMOS 212 is coupled to an output terminal TRKBL1B configured to output a strobe signal firing the following sense amplifier. The source of the PMOS 208 is coupled to the supply voltage, VDD. The drain of the PMOS 208 is coupled to the drain of the NMOS 210. The gate of the NMOS 210 is coupled to the drain of the NMOS 212. The gate of the NMOS 212 is coupled to the drain of the NMOS 210. The drain of the NMOS 216 is coupled to the drain of the NMOS 212. The source of the NMOS 216 is coupled to the supply reference voltage VSS, such the ground. The gate of the NMOS 214 is coupled to the gate of the NMOS 216 through an inverter 202. One of the two input terminals of the NAND gate 218 is coupled to the output, as Node B, of the inverter 124 in FIG. 1. The other one of the two input terminals of the NAND gate 218 is coupled to the tracking bitline TRKBL. The output of the NAND gate 218 is coupled to the gate of the NMOS 214, and to the gates of the PMOS 208 and the NMOS 216 through the inverter 202.

In an embodiment, when the PMOS 204 is on, the PMOS 206 is off. The gate voltage of the NMOS 212 is charged due to the current passing through the PMOS 204. As a result, the NMOS 212 is turned on such that there is a current passing through the NMOS 212 to pull down the voltage level at the terminal TRKBL1B. Once the voltage of the tracking bitline TRKBL is discharged to a voltage level below the reference voltage Vref, the current passing through the PMOS 206 is large enough to override the pulling down current caused by the NMOS 212. The current is therefore able to pull up the voltage at the terminal TRKBL1B.

The NAND gate 218 is configured to receive the signals of the tracking bitline TRKBL and the node B, and to generate an enabling signal EN. As a result, an enabling signal bar ENB is generated through the inverter 202. When the voltage at the node B is logical low, the enabling signal EN is triggered to the logical high level voltage, and the NMOS 214 is turned on and configured to provide current to enable the operation of the circuit in FIG. 2. The enabling signal bar ENB, which is at the logical low level voltage as a result, turns off the NMOS 216, and the voltage at the terminal TRKBL1B is pulled up by the current passing through the PMOS 206. The PMOS 208 is turned off by the enabling signal bar ENB to ensure that the NMOS 212 is ready to be at an on state.

Figure 3:
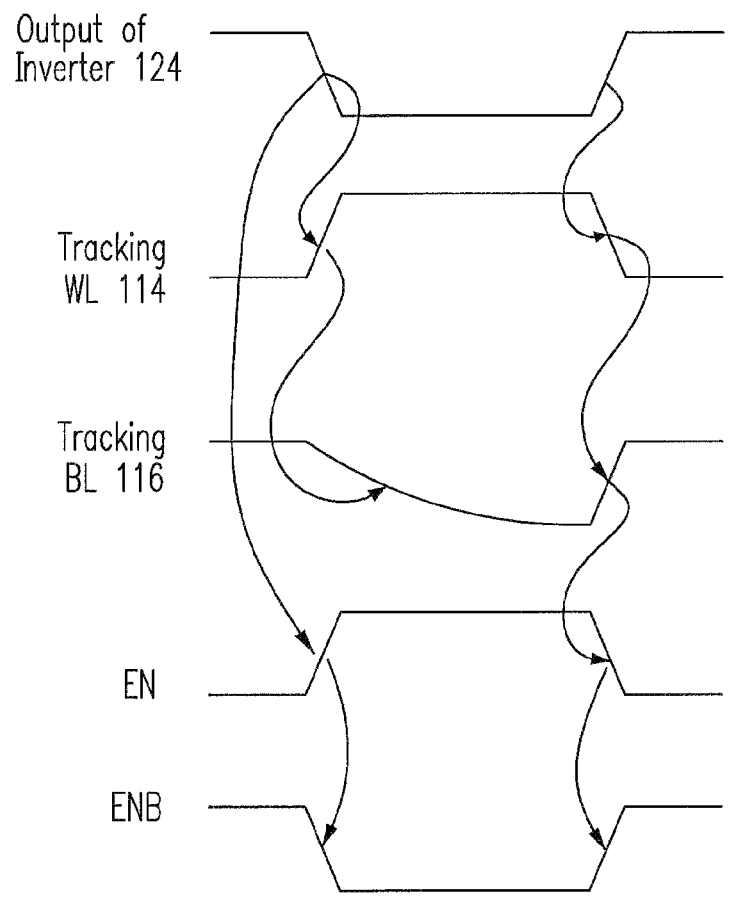
FIG. 3 is a schematic diagram illustrating a timing sequence diagram for the voltage levels at the output of the inverter 124, the tracking wordline, the tracking bitline, the enabling signal EN at the output of the NAND gate 218 and the enabling signal bar ENB at the output of the inverter 202 during the read operation in accordance with the embodiment of FIG. 2 in this disclosure.

FIG. 3 illustrates a timing sequence diagram for various voltage levels. For example, the voltage levels are at the output of the inverter 124 (node B in FIG. 1 and FIG. 2), the tracking wordline (tracking WL) 114, the tracking bitline (tracking BL) 116, the enabling signal EN at the output of the NAND gate 218 and the enabling signal bar ENB at the output of the inverter 202 in FIG. 2 during the read operation. At the start of the read operation, the falling edge at the output of the inverter 124 causes the voltage levels of the enabling signal EN and the tracking WL 114 to rise. As a result, the voltage level of the enabling signal bar ENB falls, and the tracking BL 116 is discharged for tracking the BL 106. The fell voltage level of the enabling signal bar ENB turns on the PMOS 208 such that the current passing through the PMOS 208 charges the gate of the NMOS 212 to a logical high voltage, and the NMOS 212 is turned on at the start of the read operation.

The PMOS 206 turns off by default before the tracking bitline is discharged. The gate of PMOS 204 is configured to receive the reference voltage Vref and turns on. The current passes through the PMOS 204 and pulls up the voltage of the gate of the NMOS 212. The pulled-up voltage causes a current passing through the NMOS 212 to the supply reference voltage, such the ground, to pull down the voltage at the terminal TRKBL1B. When the tracking bitline is discharged to a voltage below the reference voltage Vref, the current through the PMOS 206 becomes larger than that through the NMOS 212, such that the voltage at the terminal TRKBL1B is pulled up and function as a strobe signal configured to be provided to the following sense amplifiers 122 through the tunable logic delay 120.

Under such an implementation, the reference voltage Vref functions as a fixed trip point of tracking bitline receiver 118. To trigger the tracking bitline receiver 118 to flip the output to the positive saturation voltage level, the voltage of the tracking bitline 116 is discharged to a voltage level lower than the reference voltage Vref. In some embodiments, the reference voltage Vref is a predetermined value across PVT. Thus, the issue of trip point variation across PVT is avoided, which results in an improved tracking ratio and SRAM speed, compared with another approach.

Figure 4:
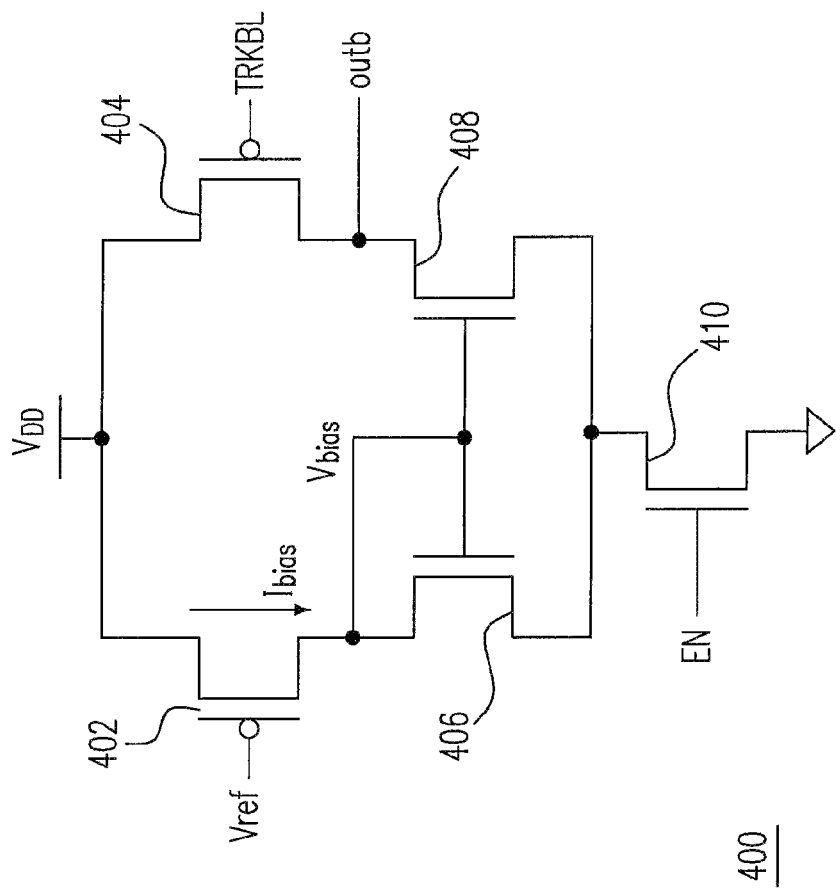
FIG. 4 is a schematic diagram illustrating a differential voltage comparator 400 implemented by a current mirror for implementing the tracking bitline receiver 118 in accordance with a further embodiment of this disclosure.

FIG. 4 is a schematic diagram illustrating a differential voltage comparator 400 implemented by a current mirror for implementing the tracking bitline receiver 118 in accordance with a further embodiment of this disclosure.

The comparator 400 includes PMOSs 402 and 404 and NMOSs 406, 408 and 410. The sources of the PMOSs 402 and 404 are coupled to the supply voltage, VDD. The gate of the PMOS 402 is configured to receive the reference voltage Vref, which, in some embodiment is 0.5 Vcc. The gate of the PMOS 404 is coupled to the tracking bitline 116. The drain of the NMOS 406 is coupled to the drain of the PMOS 402. The drain of the NMOS 408 is coupled to the drain of the PMOS 404. The sources of the NMOSs 406 and 408 are coupled to the drain of the NMOS 410. The source of the NMOS 410 is coupled to the supply reference voltage VSS, such the ground. The gate of the NMOS 410 is coupled to an output of a NAND gate, which is illustrated in detail in FIG. 6. The drain of the NMOS 408 is coupled to the terminal outb as an output of the tracking bitline receiver 118, and the gate of the NMOS 406 is coupled to the gate of the NMOS 408 and the drain of the NMOS 406.

During the read operation, the PMOS 402 at the SF corner is faster than the NMOS 406, and thus the voltage Vbias is raised higher and causes the NMOS 408 to be stronger and provide a larger current. Therefore, it becomes harder than usual for the PMOS 404 to pull up the voltage at the terminal outb since it is fought against by the NMOS 408. Thus, the gate delay of the tracking bitline receiver 118 implemented with the comparator 400 becomes larger so that the gate delay is compensated at the SF corner. The gate delay is a period of time which starts when the tracking bitline receiver 118 is triggered until the time when the tracking bitline receiver 118 outputs a positive saturation voltage.

Under the condition of low Vcc, such as 0.8×nominal Vcc or lower, and at SS corner, the tracking bitline receiver implemented by an inverter has a low operating speed. However, in the structure in FIG. 4, both threshold voltages of the PMOS 402 and NMOS 406 are relatively high at the SS corner. As a result, the bias current Ibias is relatively small such that the voltage Vbias is very low and almost cuts off the NMOS 408. Therefore, the PMOS 404 fast pulls up the terminal outb, and result in speed up at the tracking bitline receiver 118. Accordingly, the speed of the tracking bitline receiver 118 is compensated at the SS corner.

Since, in this embodiment, the comparator 400 is used for full swing large signal operating, it is not operated at a high voltage, such as the nominal Vcc±10%. Even though the NMOS 408 is cut off at a very low Vcc, such as smaller the nominal Vcc±10%, the PMOS 404 is still able to pull up the voltage at the terminal outb and maintain the function of the comparator 400.

Figure 5:
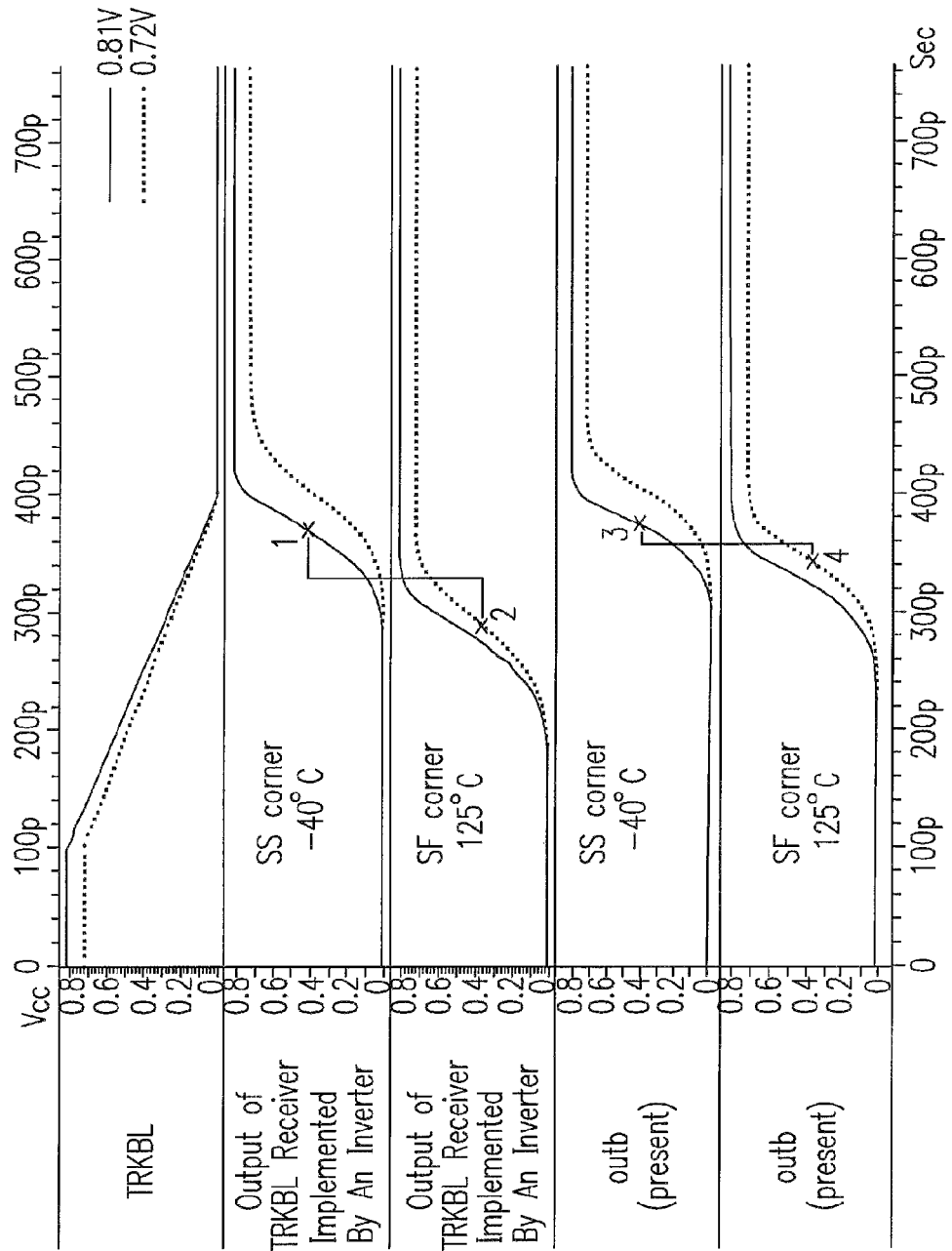
FIG. 5 is a schematic diagram illustrating a simulation result for the voltage level at the tracking bitline and the terminal outb in accordance with the embodiment of FIG. 4 in this disclosure and the tracking bitline receiver implemented by an inverter respectively at SS corner, −40° C. and SF corner, 125° C., Vcc=0.72V/0.81V.

FIG. 5 is a simulation result illustrating the voltage level at the tracking bitline, the outputs outb of the tracking bitline receiver of the present embodiment and the outputs of the tracking bitline receiver implemented by an inverter at SS corner and −40° C. and at SF corner and 125° Cf or Vcc=0.72V/0.81V. Each of the crisscross symbols is situated at where the output voltages reach 50% of the Vcc voltage. Referring to the crisscross symbol 2 and the crisscross symbol 4 in FIG. 5, the crisscross symbol 2 falls at 289 picoseconds and the crisscross symbol 4 falls at 343 picoseconds. This indicates that the output of the tracking bitline receiver in the present embodiment delays much more than that of the tracking bitline receiver implemented by an inverter at the SF corner. Therefore, the delay of the tracking bitline receiver at the SF corner is compensated and becomes closer to that at the SS corner in the present embodiment. In addition, referring to the crisscross symbol 1 and the crisscross symbol 3 in FIG. 5, the crisscross symbol 1 falls at 369 picoseconds and the crisscross symbol 3 falls at 374 picoseconds. This indicates that the speed of the tracking bitline receiver in the present embodiment is faster than that of the tracking bitline receiver implemented by an inverter at the SS corner. Therefore, the extra timing margin occurring at the tracking bitline receiver at the SS corner is compensated in the present embodiment. Moreover, since the delay of the stage of the tracking bitline receiver of the present embodiment is larger than that of the tracking bitline receiver implemented by an inverter at the SF corner, a read margin larger than that of the tracking bitline receiver implemented by an inverter is accordingly detected by the SA at the SF corner in the present embodiment. Further, since the speed of the tracking bitline receiver in the present embodiment is faster than that of the tracking bitline receiver implemented by an inverter at the SS corner, a read margin smaller that of the tracking bitline receiver implemented by an inverter is accordingly detected by the SA at the SS corner in the present embodiment. Since, in the present embodiment, a smaller read margin is obtained at the SS corner and a larger read margin is obtained at the SF corner as mentioned above, the gap between the read margin at the SS corner and the read margin at the SF corner is narrowed in the present embodiment. In some embodiments, the SF corner is the worst case corner.

Figure 6:
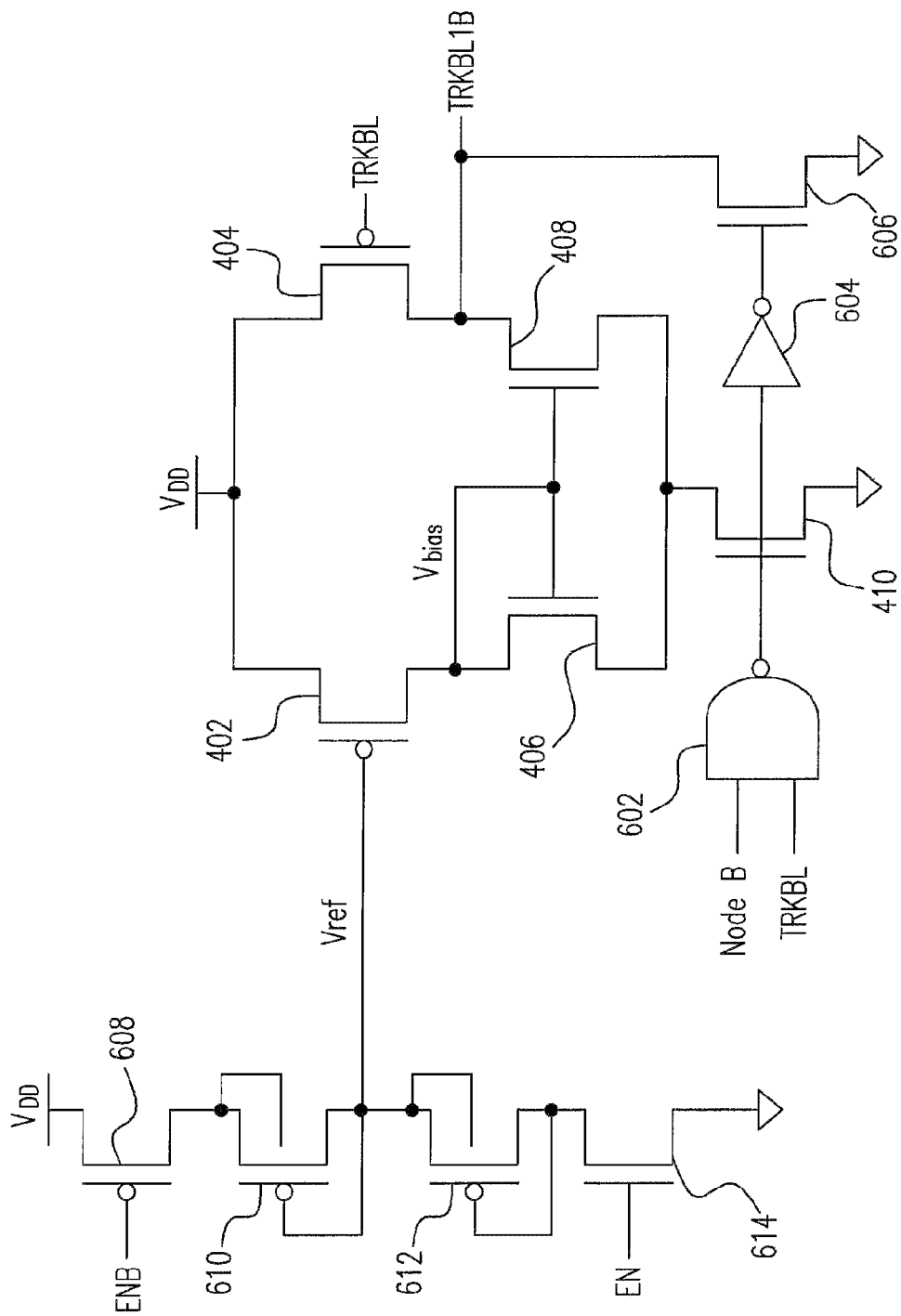
FIG. 6 is a schematic diagram, in accordance with another embodiment in this disclosure, illustrating the comparator 400 in FIG. 4 and further including a NAND gate 602, an inverter 604 and a NMOS 606 as an enabling circuit functioning as the NAND gate 218, the inverter 202 and the NMOS 216 as mentioned in the preceding embodiment in FIG. 2, respectively.

FIG. 6 is a schematic diagram of a circuit 600, in accordance with another embodiment in this disclosure, of the comparator 400 in FIG. 4. Compared with circuit 400, circuit 600 further includes a NAND gate 602, an inverter 604 and a NMOS 606 corresponding to the NAND gate 218, the inverter 202 and the NMOS 216 in FIG. 2, respectively. A reference voltage generator including PMOS 608, diode connected PMOSs 610 and 612, and NMOS 614 connected in series is also illustrated in FIG. 6. The reference voltage generator is configured to provide a reference voltage Vref of 0.5 Vcc to the gate of the PMOS 402. In addition, the width of a PMOS influences the current amount passing therethrough when the PMOS is turned on. Therefore, if the width of the PMOS 608 or 610 is relatively larger than that of the PMOS 612, the current passing through the PMOS 608 or 610 is larger than that passing through the PMOS 612, whereby a reference voltage Vref is at a level larger than 0.5 Vcc. Accordingly, the generated reference voltage Vref is able to be adjusted through adjusting the size of the PMOSs 608, 610 and 612.

Figure 7:
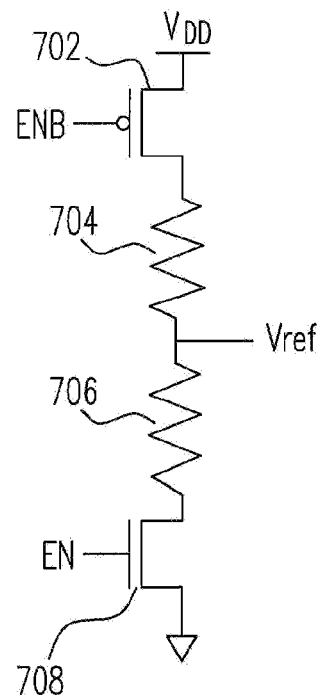
FIG. 7 is a schematic diagram illustrating another implementation for the reference voltage generator in accordance with a further embodiment in this disclosure.

FIG. 7 is a schematic diagram for another implementation for the reference voltage generator in accordance with a further embodiment in this disclosure. The reference voltage generator includes a PMOS 702, tunable resistive devices 704 and 706, and an NMOS 708. In some embodiments, the tunable resistive devices 704 and 706 are implemented by transistors or resistors. Further, the resistance ratio of the tunable resistive devices 704 and 706 is tuned to generate the desired reference voltage Vref according to the voltage-division principle of the voltage divider formed by the tunable resistive devices 704 and 706.

Figure 8:
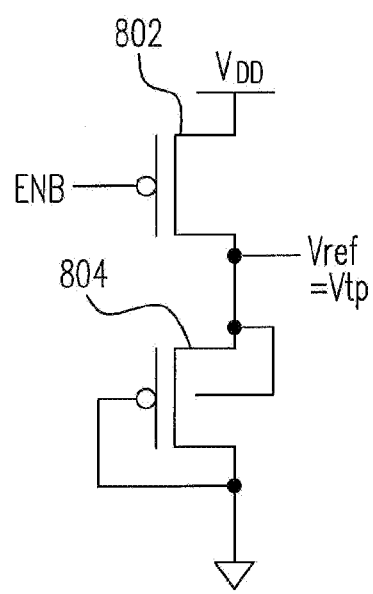
FIG. 8 is a schematic diagram illustrating yet another implementation for the reference voltage generator in accordance with yet another embodiment in this disclosure.

FIG. 8 is a schematic diagram for yet another implementation for the reference voltage generator in accordance with yet another embodiment in this disclosure. The reference voltage generator 800 includes PMOSs 802 and 804, and is configured to provide a reference voltage Vref tracking the threshold voltage of the PMOS, Vtp. Since the PMOS 804 is diode-connected as shown in FIG. 8, the voltage drop across the conducting PMOS 804 is Vtp. In other words, the generated reference voltage Vref is the threshold voltage of the PMOS, Vtp.

Under the present embodiment in FIG. 8, the TRKBL voltage is compared with the Vtp. During the read operation in the SRAM, when the voltage level at the tracking bitline 116 is pulled down, the output outb of the comparator 400 gets started to flip to the positive saturation voltage level earlier or later if the Vtp is higher or lower. At the fast corners for PMOS, such as the SF or FF corner, a PMOS has a low Vtp. The tracking bitline takes more time to be discharged to a level below the low Vtp to make the output of the comparator flip. Since more time is taken to discharge the tracking bitline to a level below the low Vtp in order to trigger the comparator 400, the gate delay of the tracking bitline receiver 118 at the SF or FF corner is therefore increased. On the contrary, at the SS corner, a PMOS has a higher Vtp, and the comparator starts to flip to the positive saturation voltage when the tracking bitline is discharged to a level below the reference voltage Vref equal to the higher Vtp. Thus, it does not takes much time to discharge the tracking bitline to a level below the reference voltage Vref, which equals to the higher Vtp, and the comparator flips earlier at the SS corner. As a result, accelerating the operation speed of the tracking bitline receiver at the SS corner is achieved.

Figure 9:
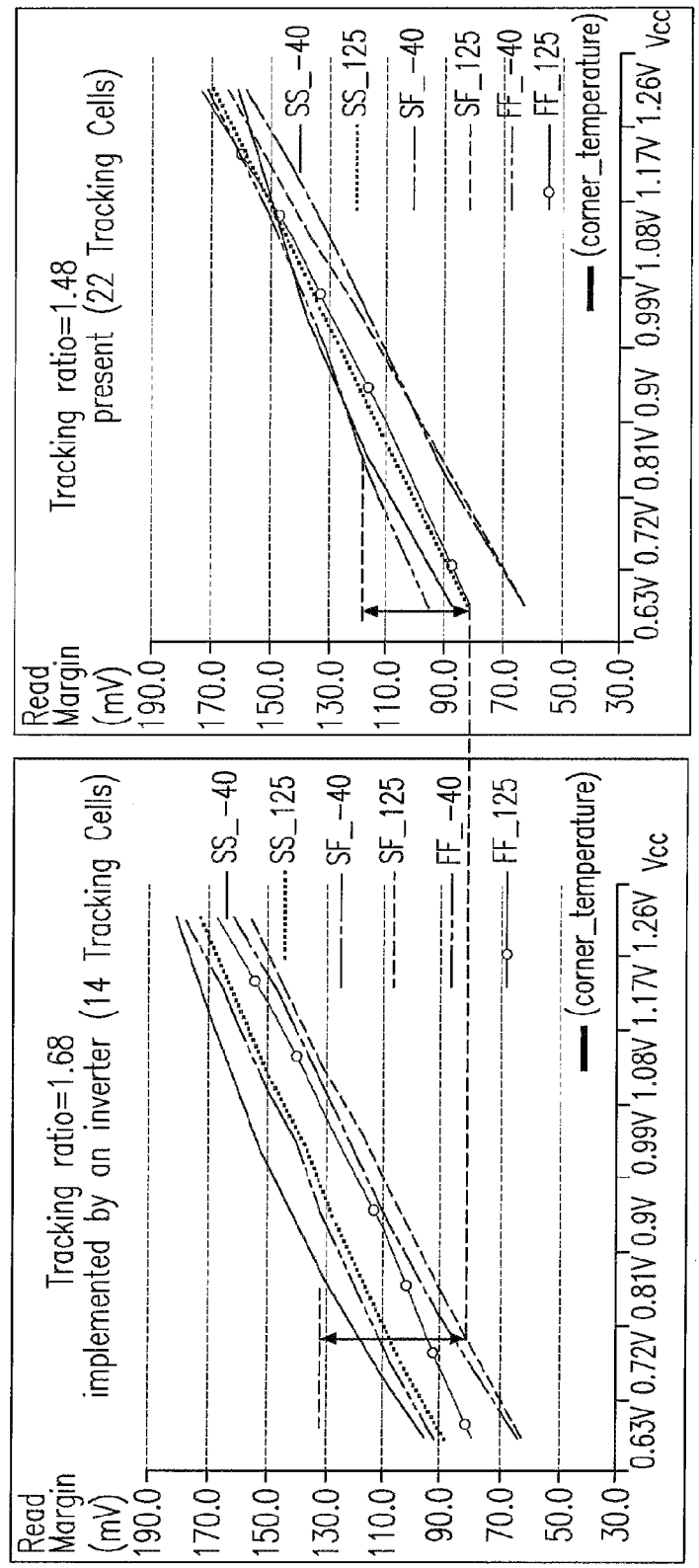
FIG. 9 is a schematic diagram illustrating the tracking ratios of the tracking bitline receiver in accordance with the yet another embodiment in this disclosure and the tracking bitline receiver implemented by an inverter.

FIG. 9 illustrates the tracking ratios of the tracking bitline receiver in accordance with the yet another embodiment in this disclosure and the tracking bitline receiver implemented by an inverter at various process corners and Vcc. The legends in FIG. 9 indicate the corners and the operation temperature. For example, the legend "SF_-40" indicates "at SF corner, -40° C.", and the legend "SF_125" indicates "at SF corner, 125° C." After calculating the tracking ratio defined by the read margin at SS corner, -40° C. and Vcc=0.81V over the read margin at SF corner, 125° C. and Vcc=0.72V, it is found that the present tracking bitline receiver has a tracking ratio equal to 1.48, which is improved (closer to 1) by 12% over the tracking bitline receiver implemented by an inverter whose tracking ratio equal to 1.68, such that the read margin across PVT is desensitized.

Figure 10:
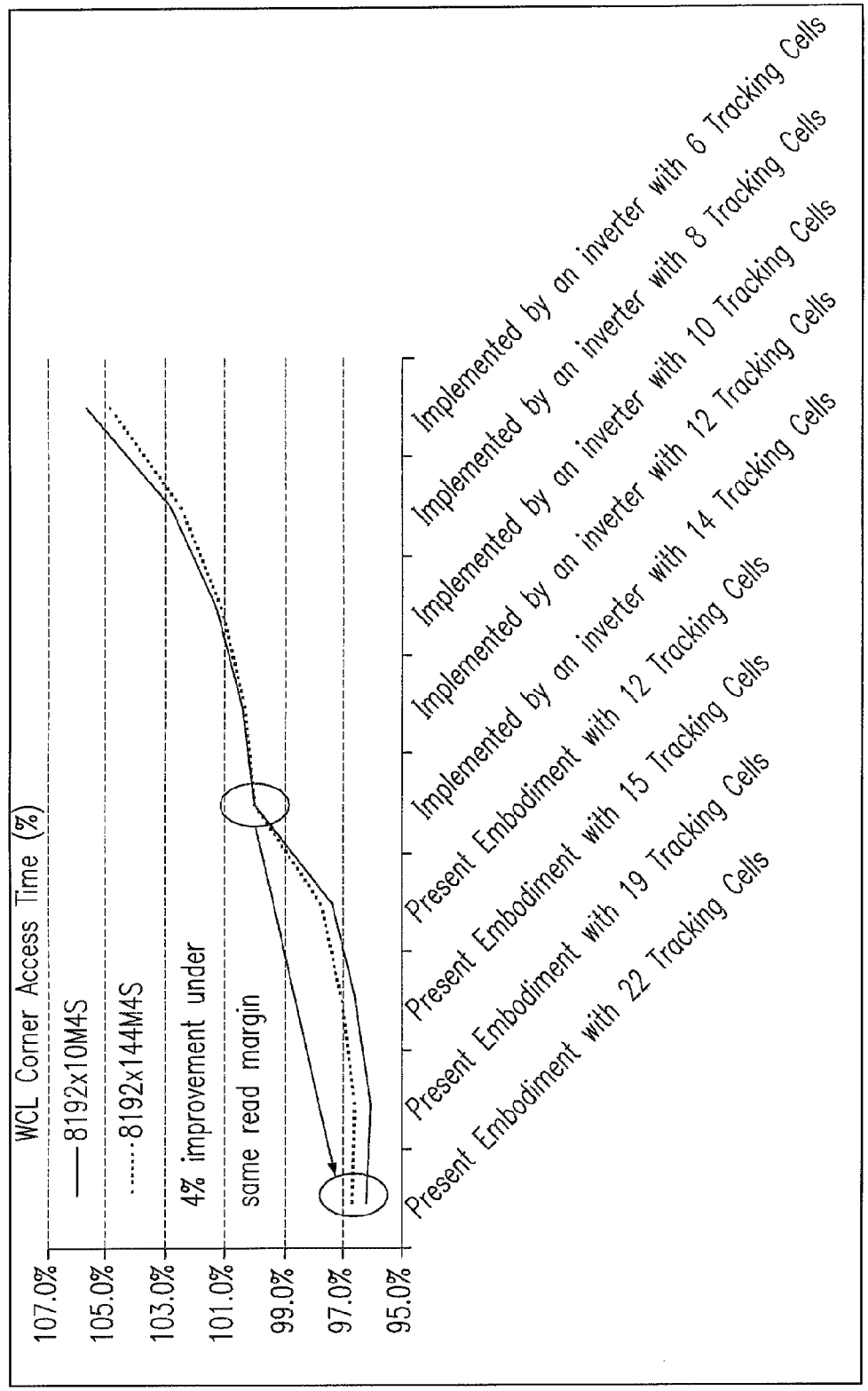
FIG. 10 is a schematic diagram illustrating a simulation result under various numbers of tracking cells for yet another embodiment in this disclosure and for the technique using an inverter as the tracking bitline receiver.

FIG. 10 is a simulation result diagram of the SRAM access time for the yet another embodiment in this disclosure using the comparator as the tracking bitline receiver and for the technique using an inverter as the tracking bitline receiver under the same read margin with various number of tracking cells. The access time resulting from the technique using an inverter as the tracking bitline receiver with 14 tracking cells is taken as the benchmark for comparing. In this simulation, the access time of the tracking bitline receiver implemented by an inverter with 14 tracking cells is taken as an example and thus is defined as 100%. The access time of the tracking bitline receiver in the present disclosure with 22 tracking cells is 96% of the example. Therefore, the simulation result shows that the access time at the WCL corner under the same read margin is improved by 4% as circled and indicated by the arrow.

In brief, by using a voltage comparator as tracking BL receiver, TRKBL is discharged to a voltage lower than a fixed reference voltage Vref before its output goes high, the tracking ratio is improved across PVT, and thus the SRAM speed is improved accordingly. In addition, the reference voltage Vref is designed to track the threshold voltage of PMOS (Vtp), such that the TRKBL is discharged to a lower level at the SF or FF corners.

EMBODIMENTS

1. A memory circuit includes a memory array having a bit line (BL), and a memory cell coupled to the BL;
a sense amplifier (SA) coupled to the BL;
a tracking bit line (TRKBL); and
a comparator coupled to the TRKBL and configured to receive a reference voltage and to output a strobe signal to the SA.

2. A circuit according to the preceding Embodiment 1, wherein
the TRKBL has a voltage; and
the comparator includes an operational amplifier (OPA) having an inverting input terminal, a non-inverting input terminal and an output terminal, wherein the non-inverting input terminal is configured to receive the reference voltage, the inverting input terminal is coupled to the TRKBL, and the output terminal is configured to output the strobe signal to the SA when the voltage of the TRKBL is smaller than the reference voltage.

3. A circuit according to one of the preceding Embodiments 1 and 2 further includes a supply voltage, wherein
the comparator further includes a first inverter,
the OPA includes a first, a second and a third p-channel MOSFETs (PMOSs) and a first, a second, a third and a fourth n-channel MOSFETs (NMOSs),
each of the PMOSs and the NMOSs has a source, a drain and a gate,
the sources of the first and the second PMOSs are coupled to the supply voltage,
the gate of the first PMOS is configured to receive the reference voltage,
the gate of the second PMOS is coupled to the TRKBL,
the drain of the first NMOS is coupled to the drain of the first PMOS,
the drain of the second NMOS is coupled to the drain of the second PMOS,
the sources of the first and the second NMOSs are coupled to the drain of the third NMOS,
the source of the third NMOS is coupled to a supply reference voltage,
the gate of the third NMOS is configured to receive an enable signal,
the drain of the second NMOS is coupled to the output terminal,
the source of the third PMOS is coupled to the supply voltage,
the drain of the third PMOS is coupled to the drain of the first NMOS,
the gate of the third PMOS is configured to receive an enable bar signal,
the gate of the first NMOS is coupled to the drain of the second NMOS,
the gate of the second NMOS is coupled to the drain of the first NMOS, the drain of the fourth NMOS is coupled to the drain of the second NMOS, the source of the fourth NMOS is coupled to the supply reference voltage, the gate of the third NMOS is coupled to an input of the first inverter, and an output of the first inverter is coupled to the gate of the fourth NMOS.

4. A circuit according to any one of the preceding Embodiments 1 to 3, wherein the reference voltage is provided based on the supply voltage.

5. A circuit according to any one of the preceding Embodiments 1 to 4 further includes a supply voltage, wherein the OPA includes a first and a second PMOSs and a first, a second and a third NMOSs, each of the PMOS and the NMOS has a source, a drain and a gate, the sources of the first and the second PMOSs are coupled to the supply voltage, the gate of the first PMOS is configured to receive the reference voltage, the gate of the second PMOS is coupled to the TRKBL, the drain of the first NMOS is coupled to the drain of the first PMOS, the drain of the second NMOS is coupled to the drain of the second PMOS, the sources of the first and the second NMOSs are coupled to the drain of the third NMOS, the source of the third NMOS is coupled to the supply reference voltage, the gate of the third NMOS is configured to receive an enable signal, the drain of the second NMOS is coupled to the output terminal, and the gate of the first NMOS is coupled to the gate of the second NMOS and the drain of the first NMOS.

6. A circuit according to any one of the preceding Embodiments 1 to 5 further includes a second and a third inverters, each of the second and the third inverters has an input and an output, a bank select (BS), a tracking wordline (TRKWL) and a tracking cell, wherein the tracking cell is coupled to the TRKWL and the TRKBL, the BS is coupled to the input of the second inverter, the output of the second inverter is coupled to the input of the third inverter, and the output of the third inverter is coupled to the TRKWL.

7. A circuit according to any one of the preceding Embodiments 1 to 6, wherein the comparator further includes an fourth inverter having an input and an output, the OPA further includes a fourth NMOS and a NAND gate having two inputs and an output, the drain of the fourth NMOS is coupled to the drain of the second NMOS, the source of the fourth NMOS is coupled to the supply reference voltage, the gate of the third NMOS is coupled to the output of the NAND gate, the TRKBL and the output of the second inverter are coupled to inputs of the NAND gate, the output of the NAND gate is coupled to the input of the fourth inverter, and the output of the fourth inverter is coupled to the gate of the fourth NMOS.

8. A circuit according to any one of the preceding Embodiments 1 to 7 further includes a reference voltage generator, wherein the reference voltage generator includes a fourth PMOS and a fifth NMOS, and a first and a second tunable resistive devices, each of the fourth PMOS and the fifth NMOS has a source, a drain and a gate, each of the first and the second tunable resistive devices has a first terminal and a second terminal, wherein the gate of the fourth PMOS is coupled to the output of the fourth inverter, the source of the fourth PMOS is coupled to the supply voltage, the drain of the fourth PMOS is coupled to the first terminal of the first tunable resistive device, the gate of the fifth NMOS is coupled to the output of the NAND gate, the source of the fifth NMOS is coupled to the supply reference voltage, the drain of the fifth NMOS is coupled to the second terminal of the second tunable resistive device, the second terminal of the first tunable resistive device is coupled to the first terminal of the second tunable resistive device, and the first terminal of the second tunable resistive device is configured to output the reference voltage.

9. A circuit according to any one of the preceding Embodiments 1 to 8 further includes a reference voltage generator, wherein the reference voltage generator includes a fourth PMOS having a source, a drain and a gate, a fifth and a sixth PMOSs, and a fifth NMOS having a source, a drain and a gate, each of the fifth and the sixth PMOSs is diode-connected and has a source, a drain and a gate, wherein the gate of the fourth PMOS is coupled to the output of the fourth inverter, the source of the fourth PMOS is coupled to the supply voltage, the drain of the fourth PMOS is coupled to the source of the fifth PMOS, the gate of the fifth NMOS is coupled to the output of the NAND gate, the source of the fifth NMOS is coupled to the supply reference voltage, the drain of the fifth NMOS is coupled to the drain of the sixth PMOS, the gate of the fifth PMOS is coupled to the drain of the fifth PMOS, the gate of the sixth PMOS is coupled to the drain of the sixth PMOS, and the source of the sixth PMOS is configured to output the reference voltage.

10. A circuit according to any one of the preceding Embodiments 1 to 9 further includes a reference voltage generator, wherein the reference voltage generator includes a fourth PMOS having a source, a drain and a gate, and a fifth PMOS being diode connected and having a source, a drain and a gate, wherein the gate of the fourth PMOS is coupled to the output of the fourth inverter, the source of the fourth PMOS is coupled to the supply voltage, the drain of the fourth PMOS is coupled to the source of the fifth PMOS, the gate of the fifth PMOS is coupled to the drain of the fifth PMOS, and the source of the fifth PMOS is configured to output the reference voltage.

11. A circuit according to any one of the preceding Embodiments 1 to 10, wherein the reference voltage is provided based on the supply voltage.

12. A memory circuit includes a sense amplifier (SA);
a memory array coupled to the SA through a bit line (BL);
a tracking bit line (TRKBL); and
a tracking bit line receiver (TRKBL receiver) coupled to the TRKBL and configured to receive a reference voltage, and to provide a strobe signal to the SA.

13. A circuit according to the preceding Embodiment 12, wherein
the TRKBL receiver includes a comparator configured to compare a voltage of the TRKBL with the reference voltage, and is configured to provide the strobe signal to the SA in order to strobe the SA when the voltage of the TRKBL is smaller than the reference voltage.

14. A circuit according to one of the preceding Embodiments 12 and 13, wherein the memory array includes a memory cell coupled to the SA through the BL.

15. A memory circuit having a sense amplifier (SA) and a tracking bit line (TRKBL) having a voltage includes a receiving circuit coupled to the TRKBL and configured to receive a reference voltage, and to use the reference voltage and the voltage of the TRKBL to activate the SA.

16. A memory circuit according to the preceding Embodiment 15, wherein the receiving circuit is configured to use the reference voltage and the voltage of the TRKBL to generate an enabling signal to activate the SA.

17. A memory circuit according to one of the preceding Embodiments 15 and 16, wherein the receiving circuit is configured to generate the enabling signal to activate the SA when the voltage of the TRKBL is smaller than the reference voltage.

18. A memory circuit according to any one of the preceding Embodiments 15 to 17, wherein the receiving circuit is a comparator configured to compare the reference voltage with the voltage of the TRKBL and to determine whether the voltage of the TRKBL is smaller than the reference voltage.

19. A memory circuit according to any one of the preceding Embodiments 1 to 18 further includes a memory array having a bit line (BL), wherein the TRKBL is configured to replicate the BL.

20. A memory circuit according to any one of the preceding Embodiments 1 to 19 further includes a tracking cell coupled to the TRKBL, wherein the memory array further comprises a memory cell coupled to the BL, and the tracking cell is configured to replicate the memory cell.

According to the aforementioned descriptions, various embodiments of the present disclosure use a comparator implemented with the characteristics of an operational amplifier 119 to do across PVT timing margin compensation in a self-timed SRAM design with bitcell tracking. The comparator is capable of replacing the tracking bitline receiver implemented by an inverter and yet using an existing tracking bitcell. Various embodiments of the present disclosure provide a better speed to the tracking bitline receiver 118 by using a comparator functioning as the tracking bitline receiver 118 so as to desensitize the trip point variation across PVT, as disclosed in the preceding embodiments. The gap between the read margin at the SS corner and the read margin at the worst case is narrowed, and thus saving unnecessary timing margin at the SS corner.

While the disclosure has been described in various embodiments, it is to be understood that the disclosure is not limited to the disclosed embodiments. On the contrary, it is intended to cover various modifications and similar arrangements.

What is claimed is:

1. A memory circuit, comprising:
a memory array having a bit line (BL), and a memory cell coupled to the BL;
a sense amplifier (SA) coupled to the BL;
a tracking bit line (TRKBL); and
a comparator coupled to the TRKBL and configured to receive a reference voltage and to output a strobe signal to the SA.

2. The circuit as claimed in claim 1, wherein
the TRKBL has a voltage; and
the comparator comprises an operational amplifier (OPA) having an inverting input terminal, a non-inverting input terminal and an output terminal, wherein the non-inverting input terminal is configured to receive the reference voltage, the inverting input terminal is coupled to the TRKBL, and the output terminal is configured to output the strobe signal to the SA when the voltage of the TRKBL is smaller than the reference voltage.

3. The circuit as claimed in claim 2 further comprising a supply voltage, wherein
the comparator further comprises a first inverter,
the OPA comprises a first, a second and a third p-channel MOSFETs (PMOSs) and a first, a second, a third and a fourth n-channel MOSFETs (NMOSs),
each of the PMOSs and the NMOSs has a source, a drain and a gate,
the sources of the first and the second PMOSs are coupled to the supply voltage,
the gate of the first PMOS is configured to receive the reference voltage,
the gate of the second PMOS is coupled to the TRKBL,
the drain of the first NMOS is coupled to the drain of the first PMOS,
the drain of the second NMOS is coupled to the drain of the second PMOS,
the sources of the first and the second NMOSs are coupled to the drain of the third NMOS,
the source of the third NMOS is coupled to a supply reference voltage,
the gate of the third NMOS is configured to receive an enable signal,
the drain of the second NMOS is coupled to the output terminal,
the source of the third PMOS is coupled to the supply voltage,
the drain of the third PMOS is coupled to the drain of the first NMOS,
the gate of the third PMOS is configured to receive an enable bar signal,
the gate of the first NMOS is coupled to the drain of the second NMOS,
the gate of the second NMOS is coupled to the drain of the first NMOS,
the drain of the fourth NMOS is coupled to the drain of the second NMOS,
the source of the fourth NMOS is coupled to the supply reference voltage,
the gate of the third NMOS is coupled to an input of the first inverter, and
an output of the first inverter is coupled to the gate of the fourth NMOS.

4. The circuit as claimed in claim 3, wherein the reference voltage is provided based on the supply voltage.

5. The circuit as claimed in claim 2 further comprising a supply voltage, wherein the OPA comprises a first and a second PMOSs and a first, a second and a third NMOSs, each of the PMOS and the NMOS has a source, a drain and a gate, the sources of the first and the second PMOSs are coupled to the supply voltage, the gate of the first PMOS is configured to receive the reference voltage, the gate of the second PMOS is coupled to the TRKBL, the drain of the first NMOS is coupled to the drain of the first PMOS, the drain of the second NMOS is coupled to the drain of the second PMOS, the sources of the first and the second NMOSs are coupled to the drain of the third NMOS, the source of the third NMOS is coupled to the supply reference voltage, the gate of the third NMOS is configured to receive an enable signal, the drain of the second NMOS is coupled to the output terminal, and the gate of the first NMOS is coupled to the gate of the second NMOS and the drain of the first NMOS.

6. The circuit as claimed in claim 5 further comprising a second and a third inverters, each of the second and the third inverters has an input and an output, a bank select (BS), a tracking wordline (TRKWL) and a tracking cell, wherein the tracking cell is coupled to the TRKWL and the TRKBL, the BS is coupled to the input of the second inverter, the output of the second inverter is coupled to the input of the third inverter, and the output of the third inverter is coupled to the TRKWL.

7. The circuit as claimed in claim 6, wherein the comparator further comprises an fourth inverter having an input and an output, the OPA further comprises a fourth NMOS and a NAND gate having two inputs and an output, the drain of the fourth NMOS is coupled to the drain of the second NMOS, the source of the fourth NMOS is coupled to the supply reference voltage, the gate of the third NMOS is coupled to the output of the NAND gate, the TRKBL and the output of the second inverter are coupled to inputs of the NAND gate, the output of the NAND gate is coupled to the input of the fourth inverter, and the output of the fourth inverter is coupled to the gate of the fourth NMOS.

8. The circuit as claimed in claim 7 further comprising a reference voltage generator, wherein the reference voltage generator comprises a fourth PMOS and a fifth NMOS, and a first and a second tunable resistive devices, each of the fourth PMOS and the fifth NMOS has a source, a drain and a gate, each of the first and the second tunable resistive devices has a first terminal and a second terminal, wherein the gate of the fourth PMOS is coupled to the output of the fourth inverter, the source of the fourth PMOS is coupled to the supply voltage, the drain of the fourth PMOS is coupled to the first terminal of the first tunable resistive device, the gate of the fifth NMOS is coupled to the output of the NAND gate, the source of the fifth NMOS is coupled to the supply reference voltage, the drain of the fifth NMOS is coupled to the second terminal of the second tunable resistive device, the second terminal of the first tunable resistive device is coupled to the first terminal of the second tunable resistive device, and the first terminal of the second tunable resistive device is configured to output the reference voltage.

9. The circuit as claimed in claim 7 further comprising a reference voltage generator, wherein the reference voltage generator comprises a fourth PMOS having a source, a drain and a gate, a fifth and a sixth PMOSs, and a fifth NMOS having a source, a drain and a gate, each of the fifth and the sixth PMOSs is diode-connected and has a source, a drain and a gate, wherein the gate of the fourth PMOS is coupled to the output of the fourth inverter, the source of the fourth PMOS is coupled to the supply voltage, the drain of the fourth PMOS is coupled to the source of the fifth PMOS, the gate of the fifth NMOS is coupled to the output of the NAND gate, the source of the fifth NMOS is coupled to the supply reference voltage, the drain of the fifth NMOS is coupled to the drain of the sixth PMOS, the gate of the fifth PMOS is coupled to the drain of the fifth PMOS, the gate of the sixth PMOS is coupled to the drain of the sixth PMOS, and the source of the sixth PMOS is configured to output the reference voltage.

10. The circuit as claimed in claim 7 further comprising a reference voltage generator, wherein the reference voltage generator comprises a fourth PMOS having a source, a drain and a gate, and a fifth PMOS being diode connected and having a source, a drain and a gate, wherein the gate of the fourth PMOS is coupled to the output of the fourth inverter, the source of the fourth PMOS is coupled to the supply voltage, the drain of the fourth PMOS is coupled to the source of the fifth PMOS, the gate of the fifth PMOS is coupled to the drain of the fifth PMOS, and the source of the fifth PMOS is configured to output the reference voltage.

11. The circuit as claimed in claim 5, wherein the reference voltage is provided based on the supply voltage.

12. A memory circuit, comprising:

a sense amplifier (SA);

a memory array coupled to the SA through a bit line (BL);

a tracking bit line (TRKBL); and a tracking bit line receiver (TRKBL receiver) coupled to the TRKBL and configured to receive a reference voltage, and to provide a strobe signal to the SA.

13. The circuit as claimed in claim 12, wherein the TRKBL receiver comprises a comparator configured to compare a voltage of the TRKBL with the reference voltage, and is configured to provide the strobe signal to the SA in order to strobe the SA when the voltage of the TRKBL is smaller than the reference voltage.

14. The circuit as claimed in claim 12, wherein the memory array comprises a memory cell coupled to the SA through the BL.

15. A memory circuit having a sense amplifier (SA) and a tracking bit line (TRKBL) having a voltage, comprising:
   a receiving circuit coupled to the TRKBL and configured to receive a reference voltage, and to use the reference voltage and the voltage of the TRKBL to activate the SA.

16. The memory circuit as claimed in claim 15, wherein the receiving circuit is configured to use the reference voltage and the voltage of the TRKBL to generate an enabling signal to activate the SA.

17. The memory circuit as claimed in claim 16, wherein the receiving circuit is configured to generate the enabling signal to activate the SA when the voltage of the TRKBL is smaller than the reference voltage.

18. The memory circuit as claimed in claim 17, wherein the receiving circuit is a comparator configured to compare the reference voltage with the voltage of the TRKBL and to determine whether the voltage of the TRKBL is smaller than the reference voltage.

19. The memory circuit as claimed in claim 15 further comprising a memory array having a bit line (BL), wherein the TRKBL is configured to replicate the BL.

20. The memory circuit as claimed in claim 19 further comprising a tracking cell coupled to the TRKBL, wherein the memory array further comprises a memory cell coupled to the BL, and the tracking cell is configured to replicate the memory cell.

\* \* \* \* \*